United States Patent [19]
Tobin et al.

[11] Patent Number: 5,771,240
[45] Date of Patent: Jun. 23, 1998

[54] TEST SYSTEMS FOR OBTAINING A SAMPLE-ON-THE-FLY EVENT TRACE FOR AN INTEGRATED CIRCUIT WITH AN INTEGRATED DEBUG TRIGGER APPARATUS AND AN EXTERNAL PULSE PIN

[75] Inventors: Paul G. Tobin, Fort Collins; Hosein Naaseh-Shahry, Windsor, both of Colo.

[73] Assignee: Hewlett-Packard Company, Palo Alto, Calif.

[21] Appl. No.: 749,189

[22] Filed: Nov. 14, 1996

[51] Int. Cl.$^6$ .................................................. G01R 31/28
[52] U.S. Cl. .................................... 371/22.1; 395/183.06
[58] Field of Search ................................ 371/22.1, 22.32, 371/22.5, 22.6, 27.7, 22.31; 395/500, 181, 183.06, 183.07, 183.21, 183.01, 183.1, 183.11, 183.15; 364/550, 580, 489; 324/500, 512

[56] References Cited

U.S. PATENT DOCUMENTS

| | | |
|---|---|---|
| 4,910,417 | 3/1990 | El Gamal et al. . |
| 5,084,814 | 1/1992 | Vaglica et al. ........................... 395/325 |
| 5,317,711 | 5/1994 | Bourekas et al. . |
| 5,321,828 | 6/1994 | Phillips et al. .......................... 395/500 |
| 5,357,628 | 10/1994 | Yuen ........................................ 395/575 |
| 5,383,192 | 1/1995 | Alexander .............................. 371/16.2 |
| 5,418,452 | 5/1995 | Pyle . |
| 5,428,626 | 6/1995 | Frisch et al. .............................. 371/27 |
| 5,473,754 | 12/1995 | Folwell et al. . |
| 5,488,688 | 1/1996 | Gonzales et al. ..................... 395/183.1 |
| 5,491,793 | 2/1996 | Somasundaram et al. ........ 395/183.21 |
| 5,566,300 | 10/1996 | Naoe .................................. 395/183.06 |
| 5,590,354 | 12/1996 | Klapproth et al. ...................... 395/800 |

*Primary Examiner*—Robert W. Beausoliel, Jr.
*Assistant Examiner*—Nadeem Iqbal

[57] ABSTRACT

Presented is test system for use in debugging functional and electrical failures of an integrated circuit. The test system includes a diagnostics retrieval system and a test access port retrieval system external to the integrated circuit under test, and a debug trigger apparatus and test access port within the integrated circuit under test. The programmable debug trigger apparatus which resides internal and integral to the integrated circuit generates a trigger capture signal within a programmed delay after a set of monitored integrated circuit signals matches a programmed trigger condition. The test access port of the integrated circuit monitors a plurality of test nodes located throughout the integrated circuit and latches a set of test node signals present on test nodes located throughout the integrated circuit when it receives a trigger capture signal from the debug trigger apparatus. The trigger capture signal is also output to an external pin of the integrated circuit as an external pulse signal to indicate that the test access port has been latched and may be downloaded by the test access port retrieval system. The integrated circuit also includes a reset input for resetting the integrated circuit to an initial state. The diagnostics retrieval system is configured to program the programmable debug trigger apparatus in the integrated circuit to set up a trigger condition and to set the programmed delay to a first delay value. The diagnostics retrieval system then initiates operation of the integrated circuit and monitors the external pulse signal. When it receives an external pulse signal, the diagnostics retrieval system causes the test access port retrieval system to download a first set of test node signals from the test access port. The diagnostics retrieval system may then reset the integrated circuit, reprogram the trigger condition, and set the programmed delay to a second delay value which is a known increment greater than the first delay value, and the process is repeated to obtain a second set of downloaded test node signals. The process may be repeated to collect as many trigger event samples as are needed to form a useful trace of test node events for use in debugging functional and electrical failures of the integrated circuit under test.

14 Claims, 10 Drawing Sheets

| DIAGNOSE REGISTER | DESCRIPTION |
| --- | --- |
| DR0 | IATOR (INSTRUCTION ADDRESS TRIGGER OFFSET) |
| DR1 | IATOER (INSTRUCTION ADDRESS TRIGGER OFFSET ENABLE) |
| DR2 | IATSIR (INSTRUCTION ADDRESS TRIGGER SPACE ID) |
| DR3 | IATSIER (INSTRUCTION ADDRESS TRIGGER SPACE ID ENABLE) |
| DR4 | IATRPNR (INSTRUCTION ADDRESS TRIGGER RPN) |
| DR5 | IATRPNER (INSTRUCTION ADDRESS TRIGGER RPN ENABLE) |
| DR6 | DATOR (DATA ADDRESS TRIGGER OFFSET) |
| DR7 | DATOER (DATA ADDRESS TRIGGER OFFSET ENABLE) |
| DR8 | DATSIR (DATA ADDRESS TRIGGER SPACE ID) |
| DR9 | DATSIER (DATA ADDRESS TRIGGER SPACE ID ENABLE) |
| DR10 | LITR (LIH INSTRUCTION TRIGGER) |
| DR11 | LITER (LIH INSTRUCTION TRIGGER ENABLE) |
| DR12 | RITR (RIH INSTRUCTION TRIGGER) |
| DR13 | RITER (RIH INSTRUCTION TRIGGER ENABLE) |
| DR14 | TP (ARBITRARY FUNCTION MINTERM SELECTOR) |
| DR15 | IC (ITERATION COUNTER) |
| DR16 | CT (COUNTDOWN TIMER) |
| DR17 | CR (TRIGGER CONTROL REGISTER) |

*FIG. 8*

TEST SYSTEMS FOR OBTAINING A SAMPLE-ON-THE-FLY EVENT TRACE FOR AN INTEGRATED CIRCUIT WITH AN INTEGRATED DEBUG TRIGGER APPARATUS AND AN EXTERNAL PULSE PIN

FIELD OF THE INVENTION

The present invention relates generally to debugging techniques for integrated circuits, and more particularly, to a test system and method for obtaining a sample-on-the-fly event trace for an integrated circuit with an integrated debug trigger apparatus and an external pin pulse for use in debugging functional and electrical failures of the integrated circuit chip.

BACKGROUND OF THE INVENTION

Integrated circuit technology has experienced a tremendous growth in the ability to provide ever increasing functional complexity in smaller and smaller integrated circuit packages. The rapid advances in integrated circuit technology provide many benefits. One such benefit is the rapid increase in computer system performance due in part to the decreased distance signals must travel within the system. Another benefit experienced by heavily integrated circuits is increased noise immunity due to fewer non-integrated system components.

In the field of integrated circuit testing and debugging, however, new problems have arisen. In the past, integrated circuits came in package sizes which had external pins large enough in size and spacing to facilitate connection to external "samplers" for signal monitoring. The signals on the external pins could therefore be input to a logic analyzer, oscilloscope, or other test equipment to monitor and test signals of interest. With smaller package sizes, however, have come fewer external pins which are often so close together that it becomes harder to sample at higher frequencies, making it impractical to make clean connections for use by external test equipment. A need has arisen, therefore, for an alternative method for extracting and monitoring integrated circuit signals in the process of testing and debugging integrated circuits.

With the increased density of circuit integration has come an increasing number of system signals which remain internal to the integrated circuit chip and which therefore remain inaccessible via external pins of the chip. The inaccessibility of internal chip signals causes great difficulty in locating functional and electrical failures in the integrated circuit during the testing and debugging process. With only the external pins available for monitoring, many functional and electrical problems of the integrated circuit are hidden because the root of the problem may be seen only at the internal signal level. A need exists, therefore, for a method of making accessible the internal signals of an integrated circuit for use in system testing and debugging.

The testing and debugging process of an integrated circuit chip typically involves monitoring a particular signal or set of signals to ensure that they meet certain criteria. One common and effective method of testing includes the setting of trigger conditions and the observation of subsequent trigger capture events on signals of interest. A trigger capture event is typically configured to capture a signal or set of signals which occur after a specified trigger condition occurs. The capturing of signal events which occur after a trigger condition is often invaluable in debugging integrated circuit functional logic failures. Captured events may be compared to expected events which should have occurred after the trigger condition occurs. More sophisticated testing and debugging tools, such as logic analyzers, provide capability for setting multiple trigger capture events, and allow repetition and different start and end conditions. With the difficulty in obtaining clean external signals and the inaccessibility of internal signals, the usefulness of external test and debug tools, however, is limited. A need exists, therefore, for a technique for providing the sophisticated functionality of powerful external debug tools to difficult-to-access external and inaccessible internal signals of an integrated circuit.

The testing and debugging of integrated circuits may involve verification of both functional logic and electrical timing. The test equipment required for verifying the functional logic of the integrated circuit may be different than that required for verifying its electrical timing. Specifically, functional logic verification requires the ability to capture pipelined signal patterns and match them to expected results. Electrical timing verification, on the other hand, requires the ability to measure the timing between signals as they occur rather than between pipeline steps. Often, verification of these two different criteria is performed using different test equipment, as for example, in the use of both a logic analyzer for a functional logic verification and debug tool and an oscilloscope for an electrical timing verification and debug tool. In creating a debug tool, it would therefore be desirable to provide the capability of testing and debugging both the functional logic and the electrical timing of an integrated circuit.

Often, the cause of a complex electrical problem may be systematically found only by observing signal transitions continuously and saving a picture of the continuous state of the integrated circuit signals before they may be altered by subsequent events. A need exists, therefore, for a debug tool which allows integrated circuit signals to be latched as soon as a trigger match occurs or at least within a known gate propagation delay as opposed to synchronizing the latch with an event pipeline and latching only on a given pipeline clock phase.

In debugging elusive electrical failures, it is common that such failures disappear when events leading up to the failure are modified. For example, the simple act of inserting additional code which is designed to capture the failure will often cause the failure to disappear when applied to a microprocessor. As a result, a need exists for a debug tool which allows the state of external and internal signals of the integrated circuit to be scanned during any given clock cycle during normal real-time operation of the integrated circuit and without modification of the events leading up to the problem. This type of tool would essentially allow integrated circuit signals to be "sampled-on-the-fly" without slowing or halting the integrated circuit system clock.

Another problem that plagues integrated circuit testing and debugging after a trigger event occurs is the difficulty in finding the edge of a monitored signal in question after a trigger event occurs. This problem arises in pipelined systems which signal a pulse on an external pin only during a given pipeline clock phase. Because a trigger match may have occurred any time leading up to the clock phase edge, the location of the edge of the monitored signal in question is unpredictable. A need exists, therefore, for a technique for providing an external pulse event which occurs at a stable and fixed time relative to a trigger match.

Accordingly, an object of the invention is to provide a tool for testing and debugging both the functional logic and the electrical timing of an integrated circuit. Another object of the invention is to provide a debug tool which allows a trigger to signal immediately or at least within a defined gate delay after a trigger match occurs as opposed to synchronizing the signaling of the trigger match with an event pipeline and latching only on a given pipeline clock phase. Another object of the invention is to provide a debug tool which allows the state of internal test node signals throughout the integrated circuit to be scanned during any given clock cycle during normal real-time operation of the integrated circuit and without modification of the events leading up to the problem. Another object of the invention is to provide a test system and method for extracting an event trace using a scan technique and a sophisticated low-cost trigger debug apparatus which is internal and integral to the integrated circuit under test and which greatly simplifies precision pin-pointing of both functional and electrical integrated circuit problems and failures.

SUMMARY OF THE INVENTION

In accordance with a preferred embodiment of the invention, a test system and method for obtaining a useful trace of events of signals of an integrated circuit for use in debugging functional and electrical failures of the integrated circuit is presented. The test system includes a diagnostics retrieval system and a test access port retrieval system external to the integrated circuit under test, and a debug trigger apparatus and test access port within the integrated circuit under test. The programmable debug trigger apparatus which resides internal and integral to the integrated circuit generates a trigger capture signal within a programmed delay after a set of monitored integrated circuit signals matches a programmed trigger condition. The test access port of the integrated circuit monitors a plurality of test nodes located throughout the integrated and latches a set of test node signals present on test nodes located throughout the integrated circuit when it receives a trigger capture signal from the debug trigger apparatus. The trigger capture signal is also output to an external pin of the integrated circuit as an external pulse signal to indicate that the test access port has been latched and may be downloaded by the test access port retrieval system. The integrated circuit also includes a reset input for resetting the integrated circuit to an initial state. The diagnostics retrieval system is configured to program the programmable debug trigger apparatus in the integrated circuit to set up a trigger condition and to set the programmed delay to a first delay value. The diagnostics retrieval system then initiates operation of the integrated circuit and monitors the external pulse signal. When it receives an external pulse signal, the diagnostics retrieval system causes the test access port retrieval system to download a first set of test node signals from the test access port. The diagnostics retrieval system may then reset the integrated circuit, reprogram the trigger condition, and set the programmed delay to a second delay value which is a known increment greater than the first delay value, and the process is repeated to obtain a second set of downloaded test node signals. The process may be repeated to collect as many trigger event samples as are needed to form a useful trace of test node events for use in debugging functional and electrical failures of the integrated circuit under test.

The debug trigger apparatus of the integrated circuit includes a plurality of software programmable trigger registers, a plurality of software programmable trigger function blocks, and a programmable countdown timer. Each trigger register monitors a plurality of integrated circuit signals which may include signals sent to the external pins of the integrated circuit and signals present internal to the chip. If the value of the monitored signals matches the programmed trigger condition, the trigger register produces a trigger match signal. Each trigger function block receives a combination of the trigger match signals generated by the trigger registers and each computes its programmed boolean minterm function on its inputs. In the preferred embodiment, the boolean minterm is computed by performing a bit-wise logical AND of the input trigger match signals with a programmed bit mask supplied by a programmable function, and then performing a bit-wise logical OR of bits in the bit-wise AND result to produce the trigger capture signal. Each trigger function block produces a trigger capture signal which may be true or false according to the computed function of the inputs.

The programmable countdown timer may be set to countdown a programmed number of clock cycles before signaling a trigger capture signal. The countdown timer is connected to receive a trigger capture signal from one of the plurality of trigger function blocks. The countdown timer is configured to keep track of the number of clock cycles which pass once its input trigger capture signal is received, and produces a countdown timer enable signal when the number of clock cycles which have passed equals the programmed clock cycle count. The ability of the debug trigger apparatus to precisely control the signaling delay of the trigger capture signal is critical to allowing the test system to iteratively retrieve continuous yet discrete test node signal events from the integrated circuit in order to form a useful trace of events for use in debugging problems and failures of the integrated circuit.

BRIEF DESCRIPTION OF THE DRAWINGS

The objects and advantages of the invention will become more apparent and more readily appreciated from the following detailed description of the presently preferred exemplary embodiment of the invention taken in conjunction with the accompanying drawings, of which:

FIG. 8 is a table of diagnose registers implemented in the preferred embodiment for programming each of the trigger registers, trigger functional blocks, and iteration and countdown timers.

DETAILED DESCRIPTION OF THE PRESENT INVENTION

The preferred embodiment of the present invention is discussed below with reference to the drawings, where like reference numbers represent like elements.

Figure 1:
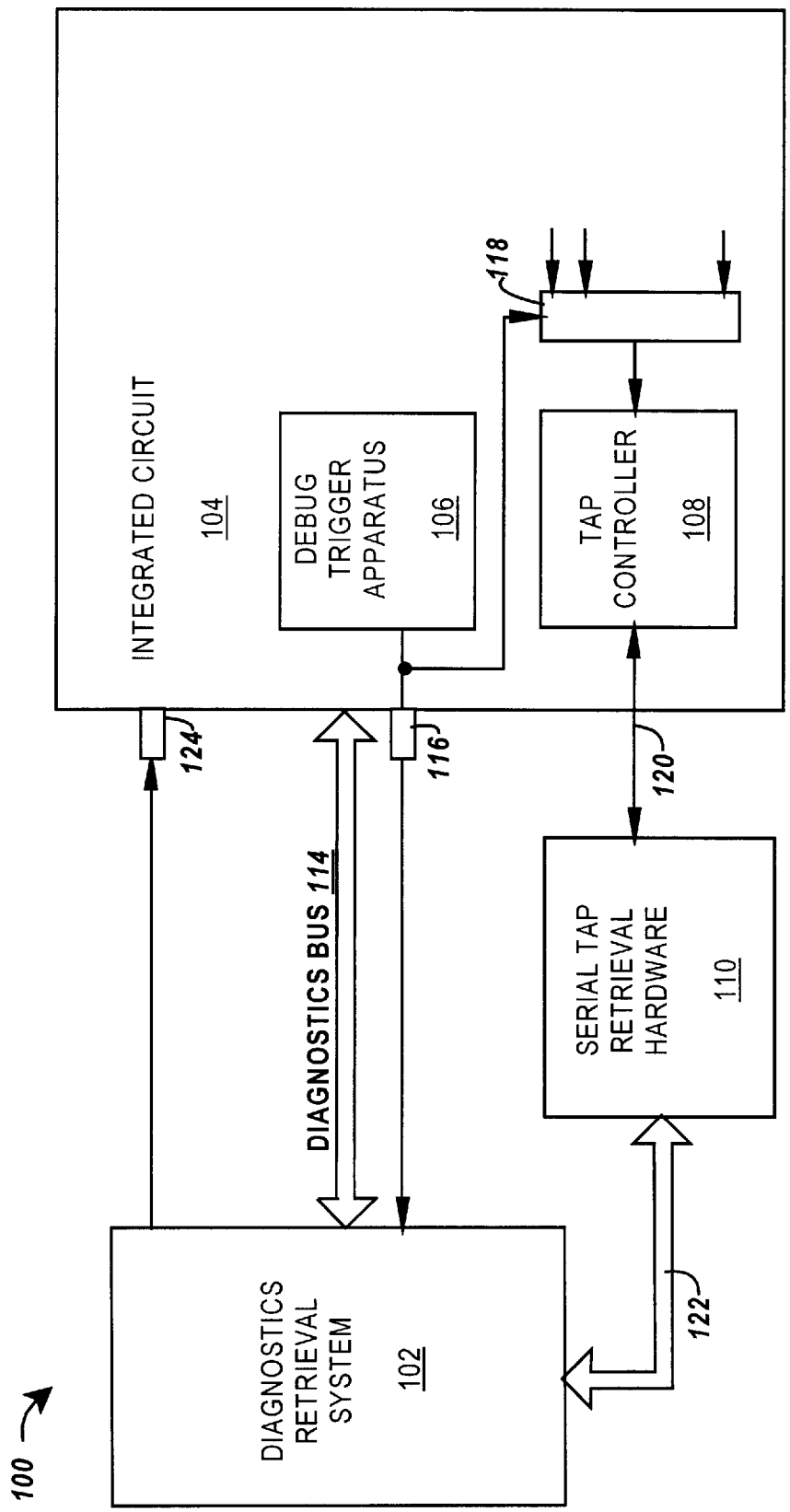
FIG. 1 is a block diagram of a test system in accordance with the present invention.

FIG. 1 is a block diagram of a test system 100 in accordance with the present invention. As shown in FIG. 1, the test system 100 includes a diagnostics retrieval system 102, an integrated circuit 104 under test and serial test access port retrieval hardware 110. The integrated circuit 104 includes a debug trigger apparatus 106. The debug trigger apparatus 106 is configured to generate an external pulse EP/SOF on an external pin 116 of the integrated circuit 104 when a software programmed trigger capture event occurs. The debug trigger apparatus 106 has the capability of setting up a variety of trigger conditions in response to diagnostic commands received by the integrated circuit 104 on a diagnostic bus 114. In the preferred embodiment, the debug trigger apparatus 106 may be programmed to set up different start and end trigger conditions, with or without event condition repetition, and with or without a programmed clock cycle delay. The external pulse signal EP/SOF is also used to latch a set of test signals from various test nodes TEST NODE 0–TEST NODE N throughout the integrated circuit 104 into a test access port (TAP) latch 118. Once the test signals from TEST NODE 0–TEST NODE N are latched, they are held in the TAP latch 118 for later retrieval by the serial TAP retrieval hardware 110 with the assistance of a conventional TAP controller 108. The external pulse signal EP/SOF is monitored on external pin 116 by the diagnostics retrieval system 102. The receipt of an external pulse signal EP/SOF signals to the diagnostics retrieval system 102 that the debug trigger apparatus 106 triggered and the values of the test nodes TEST NODE 0–TEST NODE N at the time of the trigger match are available for retrieval from the TAP latch 118. The diagnostics retrieval system 102 may then signal to the serial TAP retrieval hardware 110 to serially download the contents of the TAP latch 118 via a serial line 120 with the assistance of the on-chip TAP controller 108. In the preferred embodiment, the serial TAP retrieval hardware is implemented using a CORRELIS JTAG box, manufactured by JTAG Technologies B.V., P.O. Box 1542, 5602 BM Eindhoven, The Netherlands. In the preferred embodiment, the TAP controller 108 and serial TAP retrieval hardware conform to the well-known Institute of Electrical and Electronics Engineers (IEEE) Standard 1149.1, "Test Access Port and Boundary Scan Architecture," also known as the Joint Test Action Group (JTAG) standard. The downloaded TAP contents may then be sent from the serial TAP retrieval hardware 110 to the diagnostics retrieval system 102 via lines 122. The diagnostics retrieval system may then store the TAP contents in an event trace which may be decoded and observed at a later time by a user. The debug trigger apparatus 106 may be programmed to cause the external pulse signal EP/SOF to occur on a precise system clock cycle after a trigger match occurs. This precision delay capability allows the diagnostics retrieval system 102 to capture a highly granular event trace by performing a series of iterations of resetting the integrated chip to an initial state on a reset pin 124, programming the debug trigger apparatus with a specific trigger condition, programming the debug trigger apparatus to delay exactly one clock later for each iteration, and downloading and appending the TAP contents to an event trace within the diagnostics retrieval system 102 each time the external pulse signal EP/SOF indicates that the TAP latch 118 has been latched. A more detailed description of the operation of the test system is discussed hereinafter.

Figure 2:
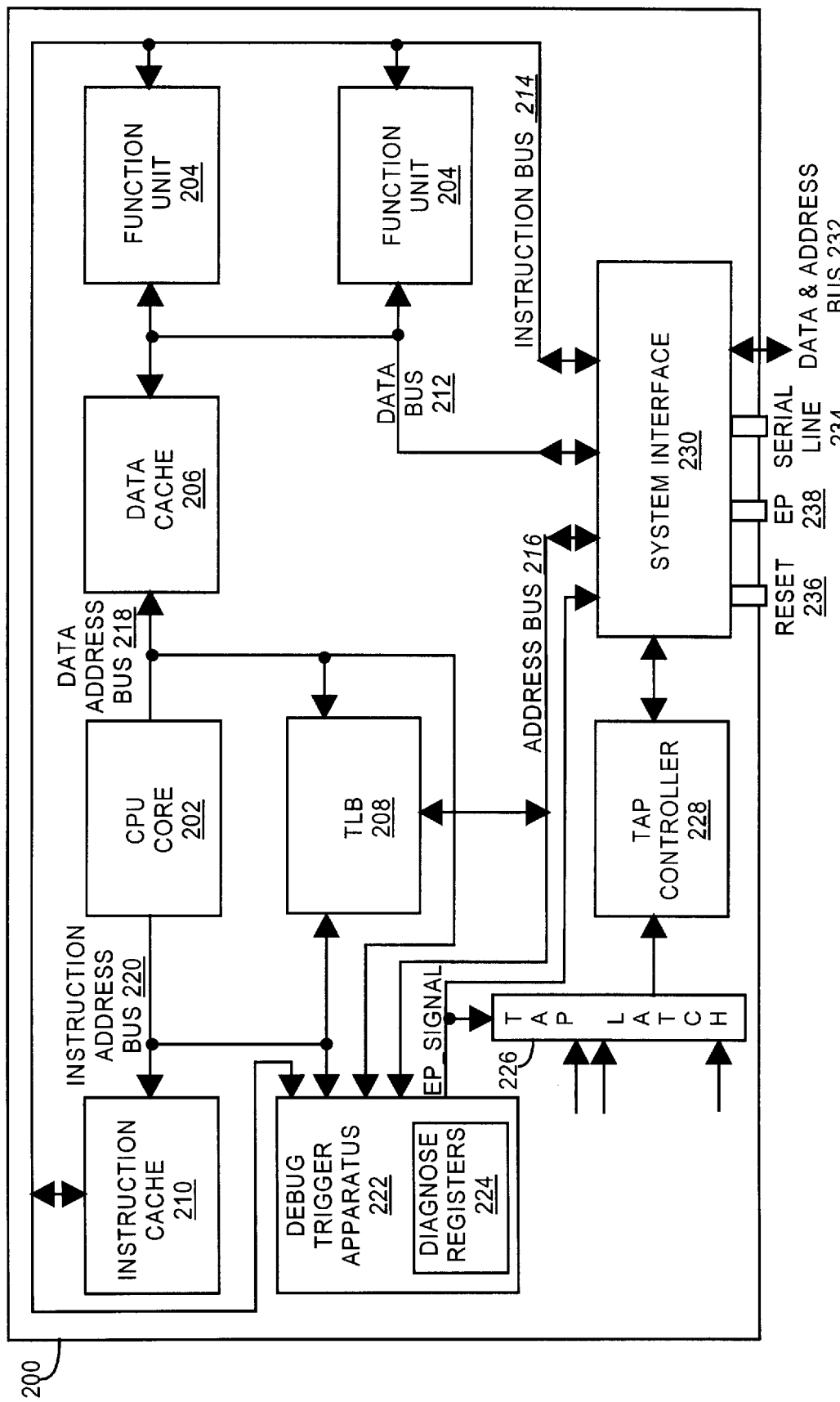
FIG. 2 is a high-level block diagram of an integrated circuit in which the present invention resides.

FIG. 2 is a high-level block diagram of an integrated circuit chip 200 in which the debug trigger apparatus used in the present invention is incorporated. The preferred embodiment of the present invention is discussed in the context of an integrated circuit 200 which implements a microprocessor architecture because the microprocessor architecture contains features which are ideally suited to illustrating the inventive principles of the invention. Although representative of the type of integrated circuit in which the present invention may be utilized to test and debug the integrated circuit, the microprocessor architecture of integrated circuit 200 is not intended in any way to limit the use of the present invention. Accordingly, the integrated circuit to which the present invention may be applied may include any other integrated circuit of interest. The integrated circuit 200 shown in FIG. 2 is a model of the computer architecture of the PA-7300LC RISC chip, manufactured by Hewlett-Packard Company, Palo Alto, Calif.

As shown in FIG. 2, integrated circuit 200 includes a central processing unit (CPU) 202. The CPU 202 receives instructions and executes them. Depending on the instruction, the CPU may delegate certain work to be completed to special function units 204. Special function units are dedicated hardware units optimally designed to perform a given function. The use of special function units 204 substantially increases the performance of a processor.

The integrated circuit 200 shown in FIG. 2 also includes an instruction cache 210 and data cache 206. Instruction fetches and data accesses each require access to data from a main memory external to the integrated circuit 200. In the integrated circuit 200 shown in FIG. 2, all instructions executed by the CPU 202 are first moved from a main memory (not shown) into the instruction cache 210 and all data accessed by the CPU 202 is first moved from main memory into the data cache 206. Move-in rules are known in the art. Typically, whenever a request for access to a given data item is issued and the cache does not contain the requested data item, the entire cache line (i.e., block of data) in main memory where the requested data item resides is moved into the cache at the same time. Most modern computer systems also support virtual addressing. To support virtual addressing, a translation lookaside buffer (TLB) is typically used to provide virtual to absolute address translations. As shown in FIG. 2, the integrated circuit includes a TLB 208 which is a shared data/instruction fetch resource. In operation, the CPU 202 requests a memory address to be accessed on either an internal instruction address bus 220 or an internal data address bus 218. The TLB 208 generally includes special hardware that signals a hit when the requested address is in the instruction cache 210 or data cache 206, or a miss when the requested address is not in the cache 210, 206. If a TLB miss occurs, special hardware causes the requested address to be moved into the appropriate cache 210, 206. Instructions and data are received from an external data and address bus 232 by a system interface 230. Instructions are sent to the instruction cache 210 on an internal instruction bus 214 and data is sent to the data cache 206 on an internal data bus 212. The TLB 208 is updated with TLB address information on an internal TLB address bus 216 whenever data is moved into or out of either cache 210, 206. From the above discussion, it is clear that the signals on the internal instruction address bus 220, data address bus 218, instruction bus 214, data bus 212, and TLB address bus 216 are inaccessible external to the integrated circuit 200 via the system interface 230.

The integrated circuit 200 also includes a debug trigger apparatus 222 which contains critical features of the invention. The debug trigger apparatus 222 may receive various signals of interest which are present on nodes located throughout the integrated circuit depending on the integrated circuit design. Accordingly, it may be deemed interesting in the integrated circuit 200 to make available the signals of each of the internal busses of the integrated circuit 200. Thus, as shown in FIG. 2, the debug trigger apparatus 222 is configured to receive signals present on each of the instruction bus 214, instruction address bus 220, data address bus 218, and TLB address bus 216. The debug trigger apparatus 222 includes diagnose registers 234 which may be programmed to set up a variety of trigger capture events, including multiple trigger events, repetitive events, different starting and ending conditions, and arbitrary clock signal delays before signaling an external pulse signal EP_SIGNAL. The debug trigger apparatus 222 produces one or more trigger capture signals depending on how it is configured. The trigger capture signals may be used for various functions including to signal an external pulse or cause a hardware breakpoint trap. In the preferred embodiment, a trigger capture signal EP_SIGNAL is used to latch a test access port (TAP) latch 226 and to signal an external pulse on an external pin EP 238. The TAP latch 226 is coupled to various test nodes TEST NODE 0–TEST NODE N throughout the integrated circuit 200. When the external diagnostics retrieval system 102 receives the EP_SIGNAL on the external pin EP 238, it may cause the serial TAP retrieval hardware 110 to serially download the contents of the TAP latch 226 via a serial line 234 with the assistance of a TAP controller 228.

Figure 3:
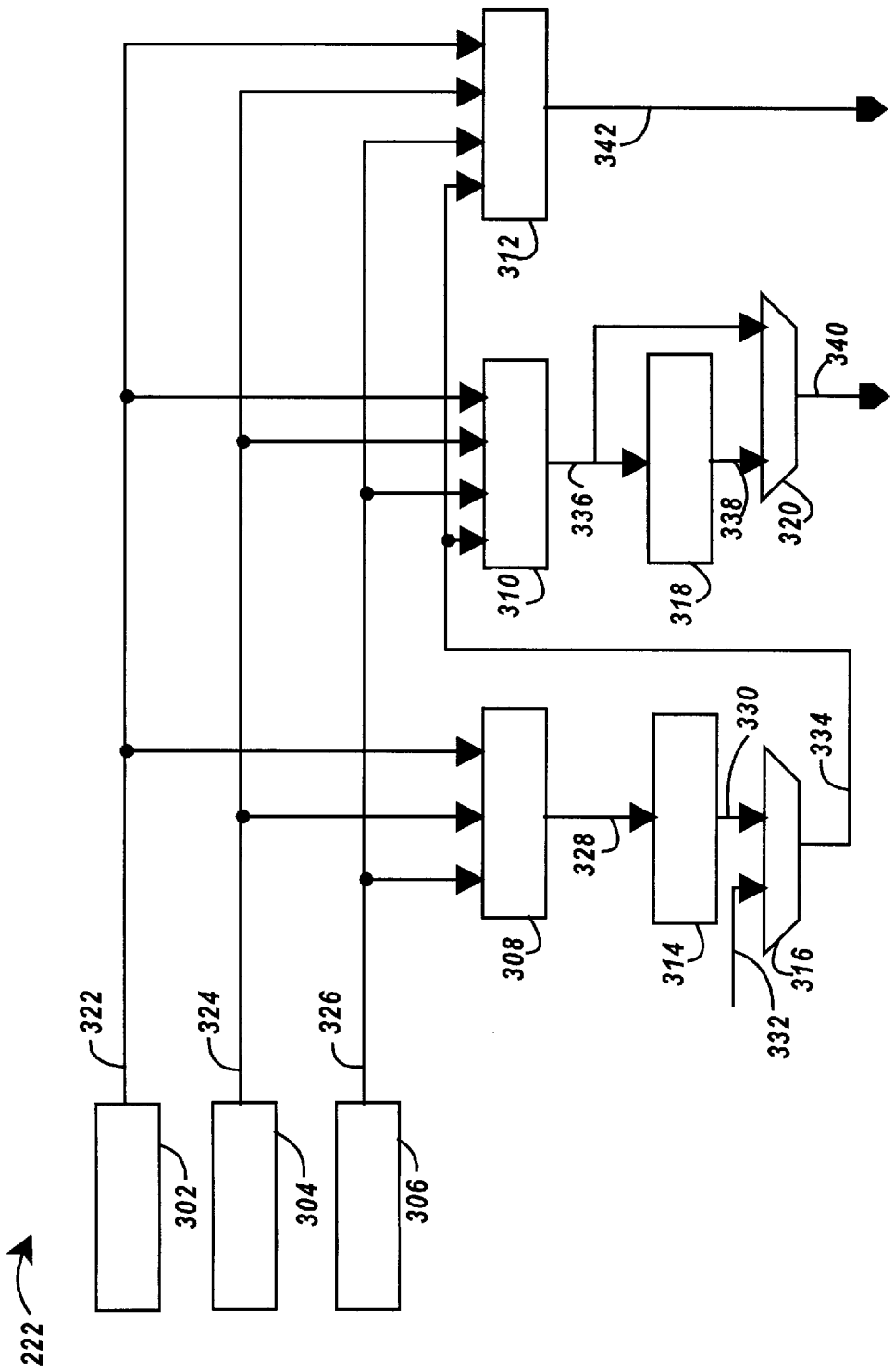
FIG. 3 is a block diagram of a debug trigger apparatus in accordance with the preferred embodiment of the present invention.

FIG. 3 is a block diagram of a preferred embodiment debug trigger apparatus for the integrated circuit 200 of FIG. 2 in accordance with the present invention. As shown in FIG. 3, the debug trigger apparatus, shown generally at 222, includes an instruction address (IA) trigger register 302, a data address (DA) trigger register 304, and an instruction data (ID) trigger register 306. The instruction address trigger register 302 is configured to monitor the internal instruction address bus 220 and look for instruction fetches from a memory address designated by the programmed value of the instruction address trigger register 302. When an instruction is fetched from a memory address which matches the programmed value of the instruction address trigger register 302, the instruction address trigger register 302 produces an instruction address trigger match signal 322. The data address trigger register 304 is configured to monitor the internal data address bus 218 and look for data accesses to and from a memory address designated by the programmed value of the data address trigger register 304. When data is accessed at a memory address which matches the programmed value of the data address trigger register 304, the data address trigger register 304 produces a data address trigger match signal 324. The instruction data trigger register 306 is configured to monitor the internal instruction bus 214 and look for an instruction pattern designated by the programmed value of the instruction data trigger register 306. When an instruction pattern is detected which matches the programmed value of the instruction data trigger register 306, the instruction data trigger register 306 produces an instruction data trigger match signal 326.

Figure 4A:
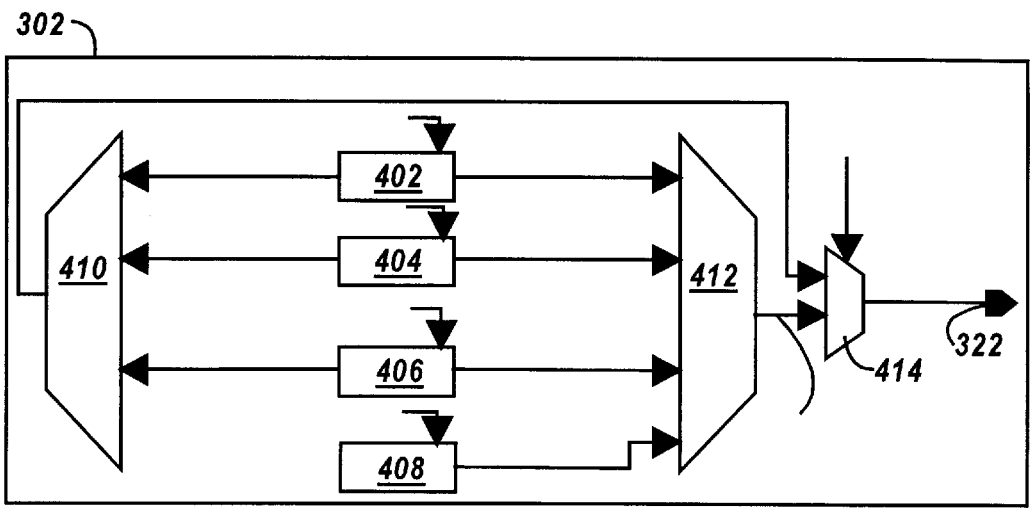
FIG. 4(a) is a block diagram of one embodiment of the instruction address register of the debug trigger apparatus of FIG. 3.

FIGS. 4(a–c) illustrate embodiments of the instruction address register 302, data address register 304 and instruction trigger register 306 of the preferred embodiment debug trigger apparatus 222 of FIG. 3. As shown in FIG. 4(a), the instruction address trigger register 302 comprises an instruction trigger offset data block 402, an instruction trigger space id data block 404, an instruction trigger real page number data block 406 and an instruction trigger virtual mode data block 408. The instruction address trigger register 302 also includes a raw match signal multiplexor 410 which receives a raw trigger match signal MATCHO_IA_R, MATCHS_IA_R, MATCHR_IA_R respectively from instruction trigger offset data block 402, instruction trigger space id data block 404, and instruction trigger real page number data block 406. The instruction address trigger register 302 also includes a pipelined match signal multiplexor 412 which receives a pipelined trigger match signal MATCHO_IA_P, MATCHS_IA_P, MATCHR_IA_P, MATCHV_IA_P respectively from instruction trigger offset data block 402, instruction trigger space id data block 404, instruction trigger real page number data block 406, and instruction trigger virtual mode data block 408. The instruction address trigger register 302 also includes a multiplexor 414 which receives a RAW_IA_MATCH signal from multiplexor 410 and a PIPED_IA_MATCH signal from multiplexor 412. The multiplexor 414 also receives a programmable select signal IA_PIPED which controls whether the RAW_IA_MATCH signal or the PIPED_IA_MATCH signal is output as the instruction address trigger match signal IA_MATCH 322.

Figure 4B:
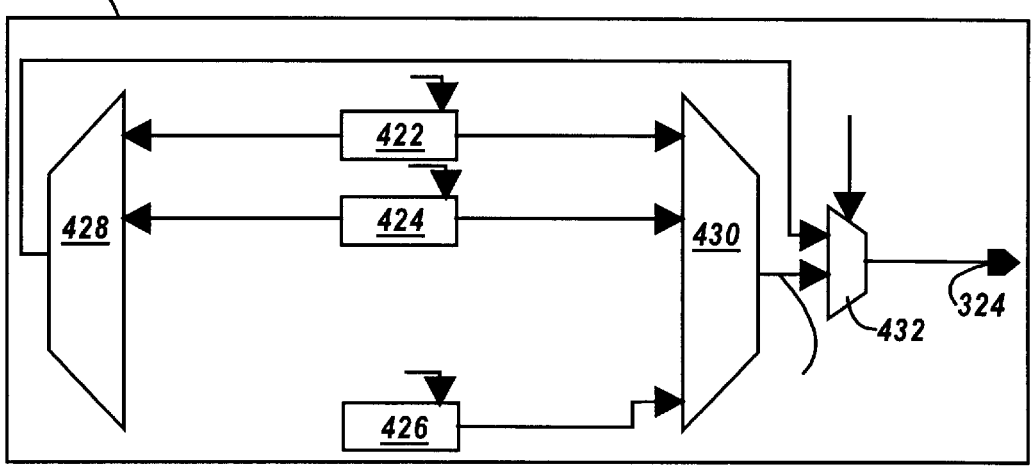
FIG. 4(b) is a block diagram of one embodiment of the data address register of the debug trigger apparatus of FIG. 3.

As also shown in FIG. 4(b), the data address trigger register 304 comprises a data trigger offset data block 422, a data trigger space id data block 424, and a data trigger virtual mode data block 426. The data address trigger register 304 also includes a raw match signal multiplexor 428 which receives a raw trigger match signal MATCHO_DA_R, MATCHS_DA_R, respectively from data trigger offset data block 422, and data trigger space id data block 424. The data address trigger register 304 also includes a pipelined match signal multiplexor 430 which receives a pipelined trigger match signal MATCHO_DA_P, MATCHS_DA_P, MATCHV_DA_P respectively from data trigger offset data block 422, data trigger space id data block 424, and data trigger virtual mode data block 426. The data address trigger register 304 also includes a multiplexor 432 which receives a RAW_DA_MATCH signal from multiplexor 428 and a PIPED_DA_MATCH signal from multiplexor 430. The multiplexor 432 also receives a programmable select signal DA_PIPED which controls whether the RAW_DA_MATCH signal or the PIPED_DA_MATCH signal is output as the data address trigger match signal DA_MATCH 324.

Figure 4C:
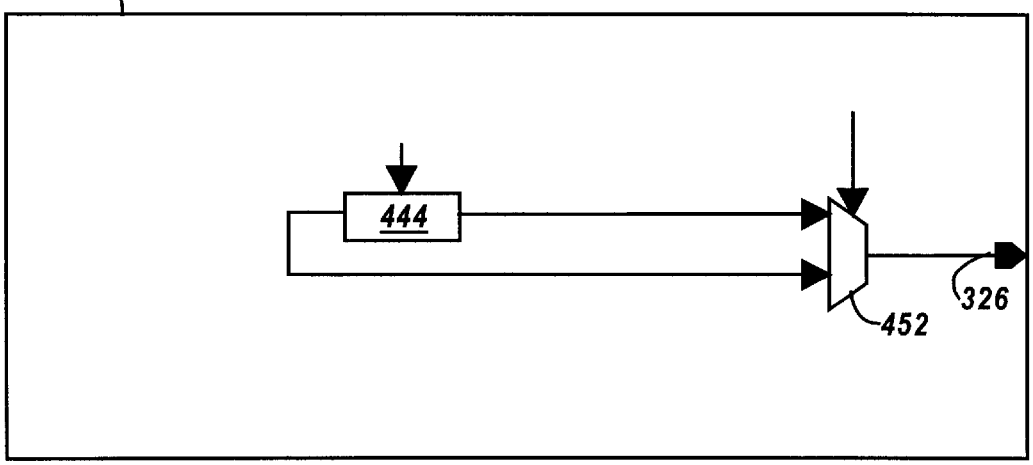
FIG. 4(c) is a block diagram of one embodiment of the instruction trigger register of the debug trigger apparatus of FIG. 3.

As also shown in FIG. 4(c), the instruction trigger register 306 comprises an instruction trigger block 442. The instruction trigger register 306 also includes a multiplexor 452 which receives a raw trigger match signal MATCHI_ID_R and a pipelined trigger match signal MATCHI_ID_P from the instruction trigger block 442. The multiplexor 452 also receives a programmable select signal ID_PIPED which controls whether the MATCHI_ID_R signal or the MATCHI_ID_P signal is output as the instruction address trigger match signal ID_MATCH 326.

Figure 5:
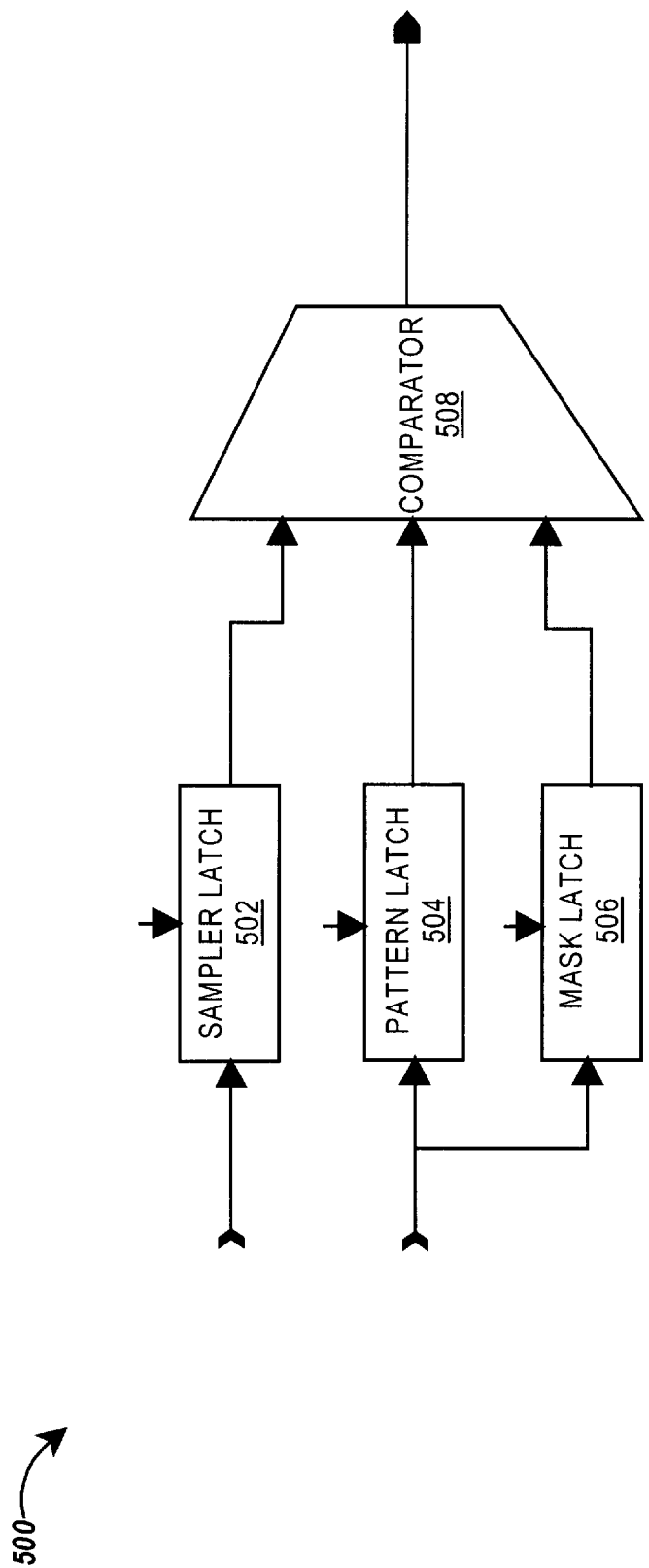
FIG. 5 is a block diagram of a trigger register block used in the implementation of the trigger registers in the preferred embodiment shown in FIGS. 4(a–c).

FIG. 5 is a more detailed block diagram of a trigger register block 500 used to implement the instruction trigger offset data block 402, instruction trigger space id data block 404, instruction trigger real page number data block 406 of instruction address trigger register 302, the data trigger offset data block 422, data trigger space id data block 424 of data address trigger register 304, and instruction trigger block 442 of instruction trigger register 306. As shown in FIG. 5, each trigger register block includes a sampler latch 502, a pattern latch 504 and a mask latch 506. The sampler latch 502 is coupled to receive as incoming DATA the signals of the particular bus that it is configured to monitor. As an example, the sample latch 502 of the instruction trigger offset data block 402 is connected to receive the portion of the instruction address bus 220 associated with the address offset, while the sample latch 502 of the instruction trigger space id block 404 is connected to receive the portion of the instruction address bus 220 associated with the space id of the instruction address. The sampler latch is clocked by a qualified clock signal CK_QUAL which may be programmed to enable sampling on each CPU clock cycle or may be programmed to enable sampling in synch with a CPU pipeline signal. The pattern latch 504 is coupled to receive a diagnostic command on DIAGNOSE_CMD which sets a pattern on which to trigger. The mask latch 506 is coupled to receive a diagnostic command on DIAGNOSE_CMD which sets a bit mask to enable a pattern range to be set up. The pattern latch 504 and mask latch 506 are set when signals SET1 and SET2 respectively are pulsed high. The comparator 508 receives the contents of each of the latches 502–506 and performs a bit-wise compare of the sample to the pattern for each bits not masked out by the mask. If the sample matches the masked pattern, the comparator signals a match signal MATCH.

The debug trigger apparatus 222 of FIG. 3 also includes a trigger functional block 0 (TFB0) 308, a trigger functional block 1 (TFB1) 310, and a trigger functional block 2 (TFB2) 312. In the preferred embodiment shown in FIG. 3, each of the trigger functional blocks 308–312 receive each of the instruction address trigger match signal 322, data address trigger match signal 324, and instruction data trigger match signal 326. Each of the trigger functional blocks 308–312 are programmable and form an arbitrary function of their inputs. In the preferred embodiment, the programmed functions are performed by computing each boolean minterm of the inputs, performing a logical AND of each minterm with a software programmed mask, and performing a logical OR of the logical AND results to produce respective trigger functional block signals 328, 336, and 342. Generally, the software programmed mask for each trigger functional block 308–312 is programmed by sending a command to the integrated circuit 200 on the data and address bus 232. Accordingly, the integrated circuit 200 must have the ability to recognize and process the trigger functional block program commands. In the integrated circuit 200 shown in FIG. 2, the CPU architecture is configured to recognize and process such debug trigger control commands and then set the programmed values of the trigger registers 302–306 and trigger functional blocks 308–312. Because each trigger register 302–306 and each trigger functional block 308–312 may be programmed separately, the user has the ability to set a wide combination of trigger conditions for use in the testing and debugging process.

Figure 6:
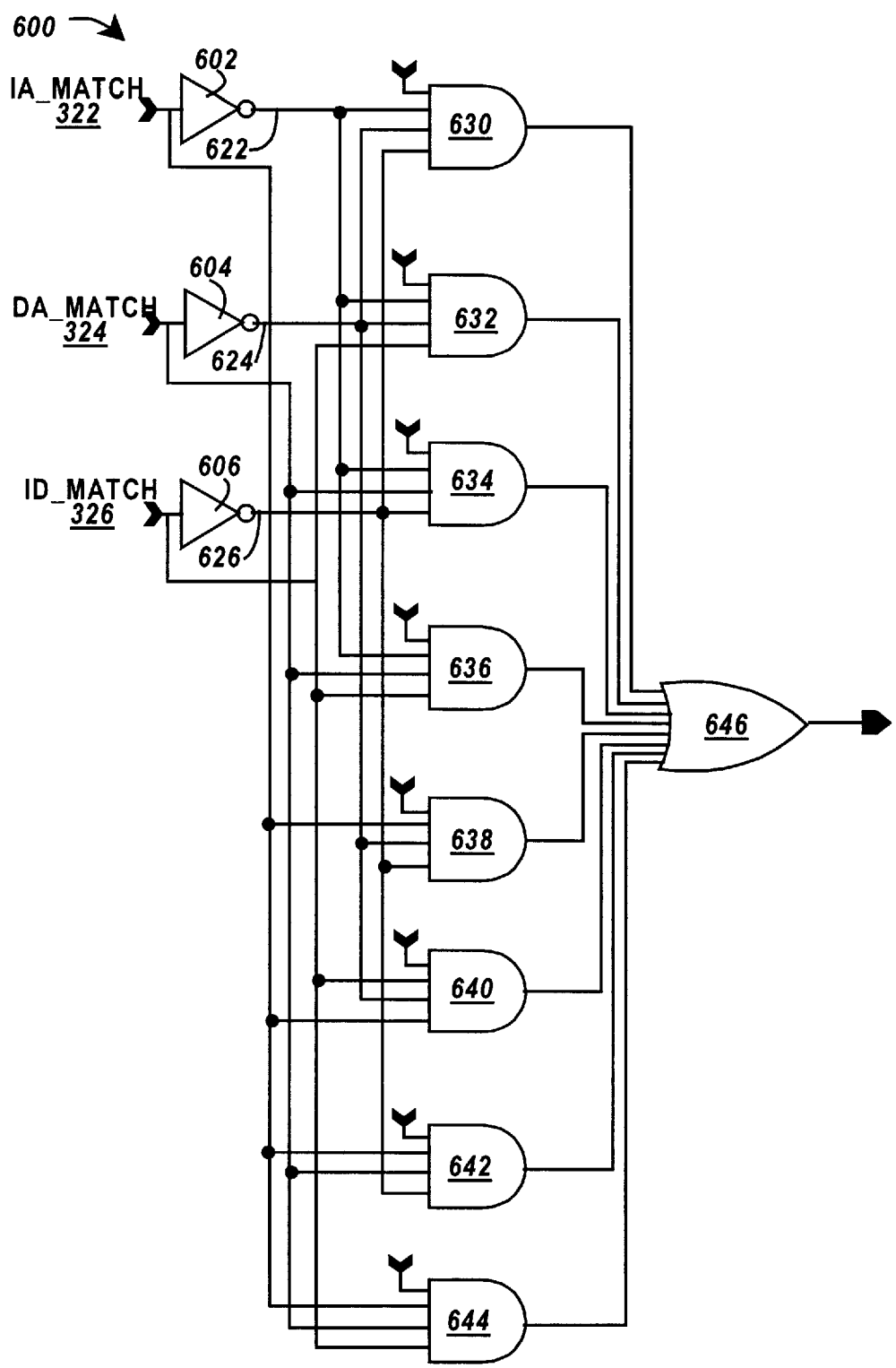
FIG. 6 is a schematic diagram of a trigger functional block used in the implementation of the preferred embodiment.

FIG. 6 is a schematic diagram of a trigger functional block 600 used to implement the trigger functional blocks 308–312 in the preferred embodiment. As shown in FIG. 6, the trigger functional block 600 receives the trigger match signals IA_MATCH 322, DA_MATCH 324 and ID_MATCH 326 from the trigger registers 302–306. Inverters 602, 604, 606 receive each of the trigger match signals 322–326 and produce inverted trigger match signals IA_MATCH' 622, DA_MATCH' 624, and ID_MATCH 626. Logical AND gates 630–644 each receives a different combination of inverted and non-inverted trigger match signals. In the trigger functional block 600, AND gate 630 receives IA_MATCH' 622, DA_MATCH' 624 and ID_MATCH' 626, while AND gate 644 receives IA_MATCH 322, DA_MATCH 324 and ID_MATCH 326. Each AND gate 630–644 also respectively receives a minterm selector signal min [0]–min [7]. The minterm selector signals min[0. .7] are programmable and allow the user to define an arbitrary number of conditions upon which to signal a trigger capture event. If the minterm selector signal for a given AND gate is enabled (set to true), the AND gate will output a logical true signal if all of its inputs are true. If the minterm selector signal for a given AND gate is not enabled (set to false), the AND gate will output a logical false regardless of the state of its inputs. The outputs of each of the AND gates are Ored together by logical OR gate 646. If any of the AND gates outputs a logical true signal, the trigger function block match signal TFB_MATCH is true. The equation performed by the trigger functional block 600 is:

| TFB_MATCH = | MIN[0] * | IA_MATCH' * | DA_MATCH' * | ID_MATCH' + |
|---|---|---|---|---|
| | MIN[1] * | IA_MATCH' * | DA_MATCH' * | ID_MATCH + |
| | MIN[2] * | IA_MATCH' * | DA_MATCH * | ID_MATCH' + |
| | MIN[3] * | IA_MATCH' * | DA_MATCH * | ID_MATCH + |
| | MIN[4] * | IA_MATCH * | DA_MATCH' * | ID_MATCH' + |
| | MIN[5] * | IA_MATCH * | DA_MATCH' * | ID_MATCH + |
| | MIN[6] * | IA_MATCH * | DA_MATCH * | ID_MATCH' + |
| | MIN[7] * | IA_MATCH * | DA_MATCH * | ID_MATCH. |

All combinations of inputs are legal. Minterm values for some interesting combinations include: $0F_{hex}$ (Instruction Address), $55_{hex}$ (Instruction), $33_{hex}$ (Data Address), and $7F_{hex}$ (either of Instruction Address, Instruction, or Data Address).

The preferred embodiment debug trigger apparatus 222 of FIG. 3 also includes additional components provided to increase its flexibility and sophistication. An iteration counter 314 is included to force N trigger matches before trigger capture events occur. The iteration counter 314 is configured to receive the trigger functional block signal 328 from trigger functional block 0 (TFB0) 308. The iteration counter 314 is programmable from the external data and address bus 232. The computer architecture of CPU 202 is configured to recognize and process iteration counter program commands and to set an iteration count value for the iteration counter 314. The iteration counter 314 produces an iteration count match signal 330 when the number of the trigger functional block signal 328 equals the programmed iteration count value. The preferred embodiment shown in FIG. 3 may also include a multiplexor 316 which is connected to receive the iteration count match signal 330 and an iteration counter output enable signal 332. The multiplexor 316 produces an enable signal 334 when either the iteration count match signal 330 or the iteration counter output enable signal 332 is both selected as input and is logically true. If it is not desired to count any iterations, the multiplexor 316 is selected to choose the iteration counter output enable signal 332, which is always logically true, as input. If iterations are to be counted, the multiplexor 316 is selected to choose the iteration count match signal 330 as input. The enable signal 334 is input to both the trigger functional block 1 (TFB1) and the trigger functional block 2 (TFB2) and used by their respective programmed functions in forming the respective trigger functional block signals 336, 342.

The debug trigger apparatus 222 of FIG. 3 also includes a countdown timer 318. The countdown timer is critical to the invention in that it allows precise programming of CPU clock cycle delay to occur after a trigger condition occurs before signaling the external pulse signal EP/SOF. As shown in FIG. 3, the countdown timer 318 connected to receive the trigger functional block signal 336 from trigger functional block 1 (TFB1). The countdown timer 318 is programmable. The computer architecture of CPU 202 is configured to recognize and process countdown timer program commands and to set a countdown timer value for the countdown timer 318. The countdown timer 318 produces a countdown timer match signal 338 when a number of clock cycles pass which equals the programmed countdown timer value. Since the countdown timer counts only the number of clock cycles that pass, it is not dependent on the CPU pipeline or architectural functionality of the integrated circuit 200. The countdown timer 318 is therefore particularly useful in debugging electrical failures of the integrated circuit 200 because signals may be monitored for proper timing rather than only proper logical functionality. The preferred embodiment shown in FIG. 3 may also include a multiplexor 320 which is connected to receive the countdown timer match signal 338 and the trigger functional block signal 336. Multiplexor 320 may be selected to accept as input the trigger functional block signal 336 when no delay is desired or the countdown timer match signal 338 when additional delay is desired. The multiplexor 320 produces a trigger capture signal 340 when the selected input signal (i.e., the countdown timer match signal 338 or the trigger functional block signal 336) is logically true. In the preferred embodiment, the trigger capture signal 340 is used as an external pin pulse signal EP_SIGNAL, which is sent to the system interface 230 and made available external to the chip via external pin EP 238. The external pulse signal EP_SIGNAL indicates to an external test system that the test access port (TAP) latch 226 coupled to various test nodes throughout the integrated circuit has been latched and may be downloaded in a "sample-on-the-fly" manner to the external diagnostics retrieval system 102.

The trigger functional block 2 (TFB2) 312 of FIG. 3 directly produces a trigger capture signal 342. In the preferred embodiment, the trigger capture signal 342 is used as a hardware breakpoint trap, which may be used to cause a change in the program execution.

Figure 7:
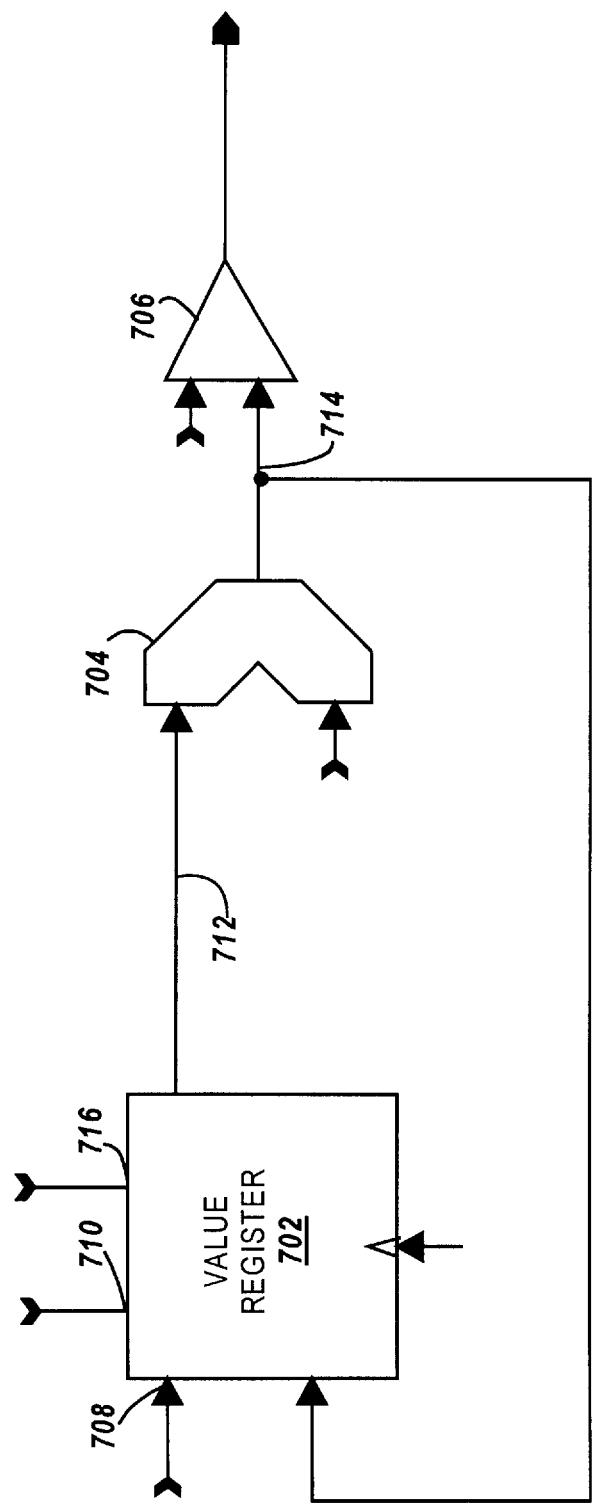
FIG. 7 is a schematic diagram of a counter used to implement the iteration counter and the countdown timer in the preferred embodiment.

FIG. 7 is a schematic diagram of a counter 700 used to implement the iteration counter 314 and the countdown timer 418 in the preferred embodiment. As shown in FIG. 7, the iteration counter 700 includes a 32—bit register 702, an adder 704, and a comparator 706. The register 702 may be programmed with a new value by placing the 32—bit value on input lines 708 and pulsing a set signal SET_VALUE on a set input 710. The register 702 is clocked by a clock signal CK, which outputs the contents of the register 702 on output lines 712 each clock cycle. The adder 704 receives the contents of the register 702 from lines 712, adds negative one, and outputs the a decremented value on lines 714. The comparator 706 receives the decremented value from lines 714, compares it to zero, and signals a count match signal COUNT_MATCH if the decremented value is equal to zero. The register 702 is also coupled to lines 714. If a decrement input 716 of the register 702 is high, the register 702 receives the decremented value as input when the clock signal CK clocks the register. When the counter 700 is used to implement the iteration counter 414, the decrement input 716 receives the direct output of trigger functional block TFB0 and thus counts down only on cycles when the TFB0 output signal is true. When the counter 700 is used to implement the countdown timer 418, the decrement input 716 of the register 702 is held low until trigger functional block TFB1 signals a match, and then the decrement input stays true until the timer reaches zero and COUNT_MATCH is signaled regardless of the state of TFB1.

Figure 9:
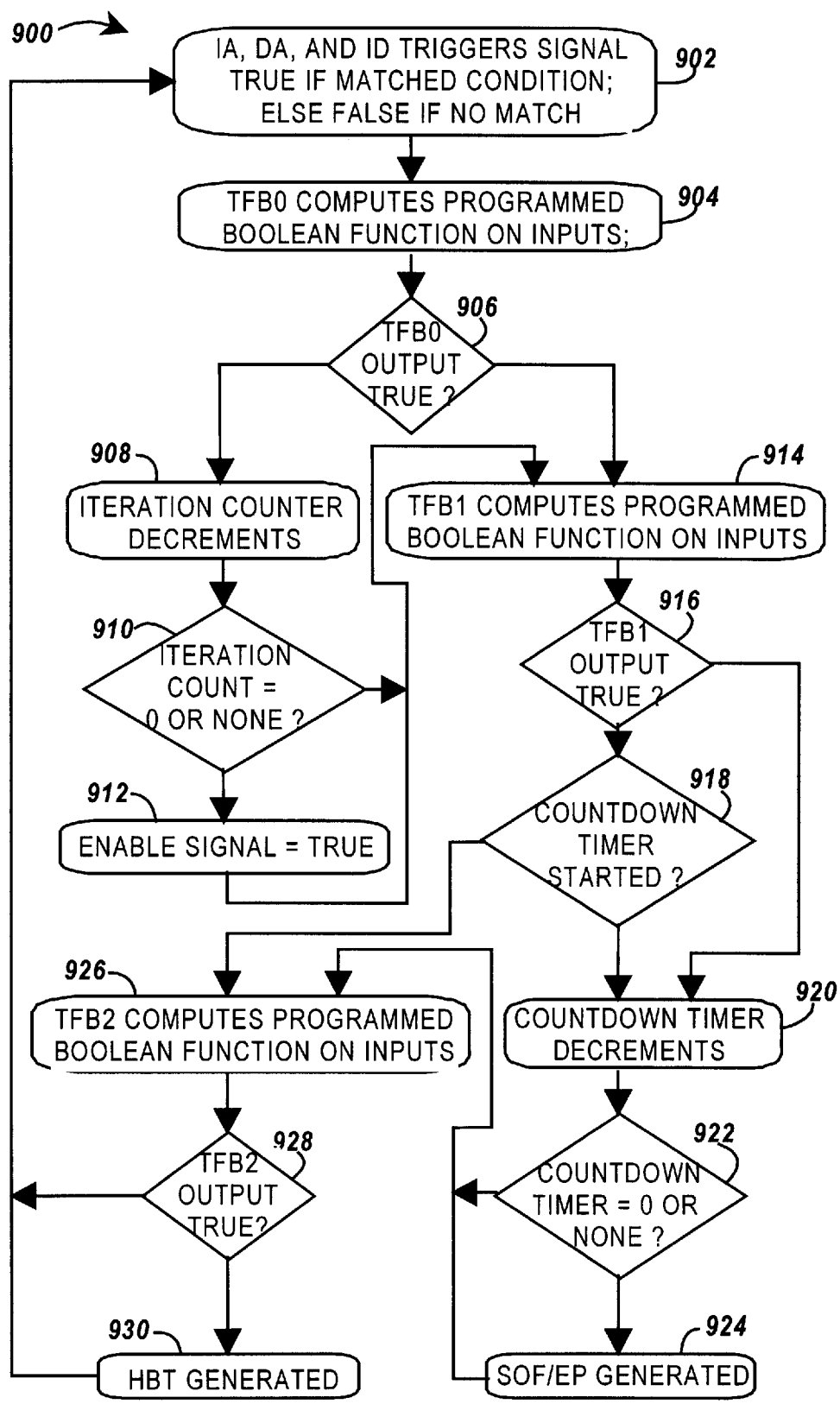
FIG. 9 is a flowchart of the of the debug trigger apparatus of FIG. 3 once the debug logic has been programmed.

FIG. 8 shows a table of the registers used to program each of the instruction address trigger register 302, data address trigger register 304, instruction data trigger register 306, trigger functional blocks 308–312, iteration counter 314, and countdown timer 318 of FIG. 3. As shown in FIG. 8, the diagnose registers include an instruction address trigger offset register IATOR DR0 and an instruction address trigger offset enable register IATOER DR1, an instruction address trigger space id register IATSIR DR2 and an instruction address trigger space id enable register IATSIRE DR3, an instruction address trigger real page number register IATRPN DR4 and an instruction address trigger real page number enable register IATRPNE DR5. The diagnose registers also include a data address trigger offset register DATOR DR6 and a data address trigger offset enable register DATOER DR7, and a data address trigger space id register DATSIR DR8 and a data address trigger space id enable register DATSIRE DR9. The diagnose registers also include an instruction trigger register ITR DR10 and an instruction trigger enable register ITER DR11. The diagnose registers also include an arbitrary function minterm selector (or trigger program) register TP DR14, an iteration counter register IC DR15, a countdown timer register CT DR16, and a trigger control register CR DR26. Registers DR0, 2, 4, 6, 8 and 10 correspond to the pattern latch 504 in FIG. 5. Registers DR1, 3, 5, 7, 9 and 11 correspond to the mask latch 506 in FIG. 5. Register TP comprises the minterm bits min[0. .7] for each of the trigger functional blocks TFB0, TFB1 and TFB2. The control register CR contains bits corresponding to the IA_PIPED, DA_PIPED and ID_PIPED signals among other control information. The diagnose registers are programmed by sending diagnose commands to the integrated circuit 200 on the data and address bus 234 to the system interface 230. The CPU architecture is configured to recognize and process the diagnostics commands and set up the diagnose registers accordingly. FIG. 9 shows a flowchart of the operation, shown generally at 900, of the debug trigger apparatus 222 of FIG. 3 once the debug logic has been programmed. As shown in FIG. 9, address (IA) trigger register 302, data address (DA) trigger register 304, and instruction data (ID) trigger register 306 begins with a step 902 in which each of the instruction address (IA) trigger register 302, data address (DA) trigger register 304, and instruction data (ID) trigger register 306 produce a logically true signal as its respective instruction address trigger match signal 322, data address trigger match signal 324, and instruction data trigger match signal 326 if its respective programmed trigger value matches the respective signals which it is configured to monitor. A logically false signal is respectively produced by the instruction address (IA) trigger register 302, data address (DA) trigger register 304, and instruction data (ID) trigger register 306 when no match occurs. The operation 900 of the debug trigger apparatus 222 continues in step 904 where trigger functional block 0 (TFB0) 308 computes its programmed boolean function of the three trigger register outputs 322–326. The trigger functional block 0 (TFB0) outputs a logically true trigger functional block signal 328 if the programmed function results in a logically true result, and outputs a logically false signal 328 if the programmed function results in a logically false result. In step 906, the debug trigger apparatus determines whether the trigger functional block signal 328 output by trigger functional block 0 (TFB0) is logically true. If the trigger functional block signal 328 is true, the debug trigger apparatus 300 decrements the iteration counter 314 by one in step 908. Then, in step 910 it is determined whether the iteration count has been decremented to 0 or whether there was no initial programmed iteration count. If either of these conditions is true, then in step 912 the iteration counter 314 outputs a logically true enable signal 334. If both of the conditions are false, the enable signal 334 is logically false. It will be noted that if no iteration count was programmed, the iteration counter 314 acts as a pass-through register and the first TFB0 match causes the enable signal 334 to be logically true.

The operation 900 of the debug trigger apparatus then continues in step 914 where trigger functional block 1 (TFB1) 310 computes its programmed boolean function of the enable signal 334 and the three trigger register outputs 322–326. In step 916, it is determined whether the output trigger functional block signal 336 is logically true or false. If the trigger functional block signal 336 is logically true, the countdown timer 318 is started if not yet started and then decremented in step 920. If the trigger functional block signal 336 is logically false, it is determined in step 918 whether the countdown time had already been started previously. If the countdown timer 318 had already been started on a previous cycle, the countdown timer is decremented in step 920. If the countdown timer gets decremented in step 920, step 922 is executed in which it is determined whether the countdown timer has decremented to 0 or whether there was no delay initially programmed. If either of these conditions is true, a trigger capture signal 342 is sent to an external pin to generate the external pulse signal EP/SOF in step 924.

The operation 900 of the debug trigger apparatus 222 then continues in step 926 where trigger functional block 2 (TFB2) computes its programmed boolean function of the enable signal 334 and the three trigger outputs 322–326 from the trigger registers 302–306. In step 928 it is determined whether the trigger functional block signal 342 is true. If the trigger functional block signal 342 is true, a trigger capture signal 342 is generated and signals a hardware breakpoint trap in step 930. Steps 902 through 930 are repeated each CPU clock cycle.

Figure 10:
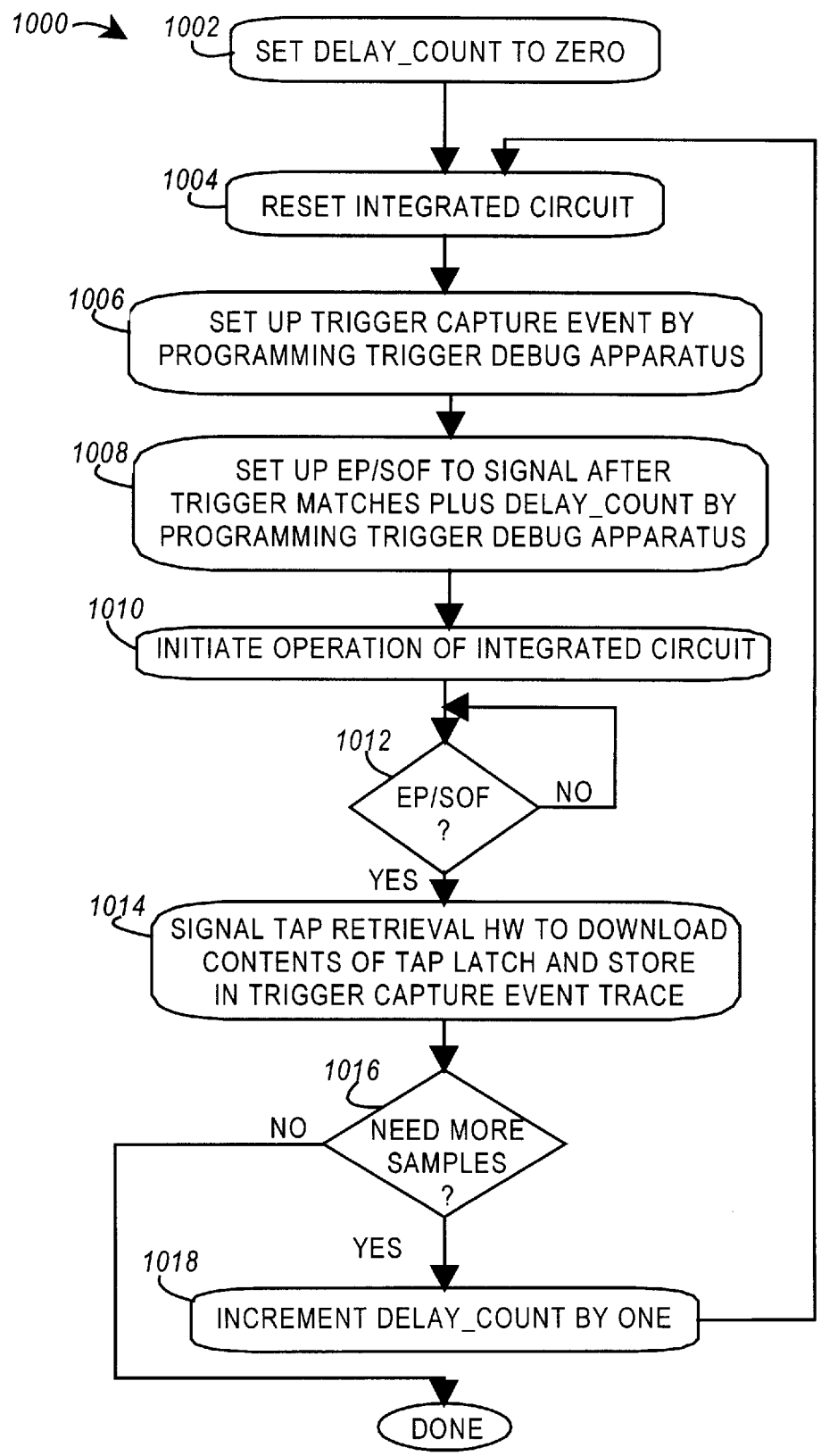
FIG. 10 is a flowchart of the operation of the diagnostics retrieval system of FIG. 1 in accordance with the method of the present invention.

FIG. 10 is a flowchart 1000 of the operation of a preferred embodiment diagnostics retrieval system. In the preferred embodiment, the diagnostics retrieval system 102 has storage capability for storing a trigger capture event trace comprising the values of a plurality of test node signal entries for a plurality of contiguous clock cycles. To capture a trace of the internal test node signals, the diagnostics retrieval system 102 begins in step 1002 by setting an initial delay count (delay_count) to an initial delay value, which most often will be zero. A delay value of zero will cause the external pulse signal to signal a fixed gate propagation delay after a trigger match occurs. In a step 1004, the diagnostics retrieval system 102 pulses the reset line 124 of the integrated circuit 104 to reset the chip to its initial state. Then, in step 1006, the diagnostics retrieval system programs the trigger registers and trigger function blocks of the debug trigger apparatus 106 to generate an external pulse signal (EP/SOF) upon the occurrence of a given trigger condition. In step 1008 the diagnostics retrieval system 102 programs the countdown timer of the debug trigger apparatus with the delay count delay_count. Operation of the integrated circuit is then initiated in step 1010. In step 1012, the diagnostics retrieval system 102 continuously monitors the external pulse signal EP/SOF until the value of the external pulse signal EP/SOF indicates that a trigger capture event has occurred. Then, in step 1014, the diagnostics retrieval system 102 signals to the serial TAP retrieval hardware 110 to download the contents of the TAP latch 118 with the assistance of the TAP controller 108. The serial TAP retrieval hardware 110 sends the contents of the TAP latch 118 to the diagnostics retrieval system 102 for storage in a trigger capture event trace. In step 1016, the diagnostics retrieval system determines whether more trace samples are needed. The number of trace samples requested may be input by a user or may comprise a fixed number. The number of trace samples preferably is large enough to capture all the changing test node signal values before they finally stabilize. If more samples are still needed, the diagnostics retrieval system increments the delay_count by one clock cycle in step 1018, and then repeats steps 1004, where the integrated circuit is reset, through steps 1016. When enough samples have been retrieved, the capturing of the trigger event trace is complete. The diagnostics retrieval system 102 preferably includes means to display the captured trace, including appropriate depiper means for sorting the trace events and presenting them in a readable format.

It will be appreciated from the above discussion that the present invention provides a unique method and system for capturing an entire trace of internal signal events after a trigger condition occurs, even in the event of a system hang. The invention thus provides a sophisticated test system for use in precise pin-pointing of integrated circuit problems and failures. A set of trigger registers internal to the integrated circuit may be software programmed to recognize a variety of conditions during the operation of the integrated circuit while allowing internal integrated circuit signals to be monitored for use in testing and debugging integrated circuits.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. A test system for debugging functional and electrical failures of an integrated circuit, comprising:

a programmable debug trigger apparatus disposed internal and integral to said integrated circuit for generating a trigger capture signal a programmed time delay after a plurality of integrated circuit signals satisfy a predetermined relationship to a programmed trigger event;

a test access port (TAP) disposed internal and integral to said integrated circuit comprising a TAP latch, said TAP latch coupled to a plurality of test nodes internal to said integrated circuit and responsive to said trigger capture signal for latching a plurality of test node signals present on said plurality of test nodes when said trigger capture signal is received;

an external output of said integrated circuit coupled to said TAP and responsive to said trigger capture signal for outputting an external output signal to indicate that said TAP latch has been latched;

a reset input of said integrated circuit for resetting said integrated circuit to an initial state;

a test access port retrieval system coupled to said TAP; and a diagnostics retrieval system coupled to said integrated circuit and configured to reset said integrated circuit to said initial state, to program said programmed trigger event to a predetermined trigger capture event and said programmed time delay to a first delay value, to receive said external output signal, and to retrieve said plurality of test node signals from said TAP latch when said external output signal indicates that said TAP latch has been latched.

2. The test system of claim 1, said diagnostics retrieval system further configured to reset the integrated circuit again, to program said programmed trigger event to said predetermined trigger capture event and said programmed time delay to a second delay value which is incrementally greater than said first delay value, to receive said external output signal, and to retrieve said plurality of test node signals from said TAP latch when said external output signal indicates that said TAP latch has been latched.

3. The test system of claim 1, said diagnostics retrieval system comprising:

storage means for storing said plurality of test node signals retrieved by said test access port retrieval system.

4. The test system of claim 1, said diagnostics retrieval system comprising:

displaying means for displaying said plurality of test node signals retrieved by said test access port retrieval system.

5. The test system of claim 1, wherein said test access port retrieval system retrieves said plurality of test node signals from said test access port via a serial line using a JTAG protocol.

6. The test system of claim 1, wherein said debug trigger apparatus comprises:

a plurality of programmable trigger registers disposed internal and integral to said integrated circuit, each trigger register configured to receive a plurality of integrated circuit signals, to compare each of said plurality of integrated circuit signals of said integrated circuit to a programmed trigger condition, and to produce a trigger match signal when said plurality of integrated circuit signals match said programmed trigger condition;

a plurality of programmable trigger function blocks disposed internal and integral to said integrated circuit, each trigger function block coupled to receive a plurality of said trigger match signals and performing a programmed boolean minterm function on the monitored trigger match signals to produce a trigger capture signal; and a programmable timer disposed internal and integral to said integrated circuit enabled by said trigger capture signal of a first corresponding one of said programmable trigger function blocks to generate a timer enable signal upon completion of a programmed time delay.

7. The debug trigger apparatus of claim 6, further comprising:

a programmable iteration counter disposed internal and integral to said integrated circuit and coupled to receive said trigger capture signal of a second corresponding one of said programmable trigger function blocks, said programmable iteration counter generating an iteration count enable signal upon receipt of said trigger capture signal of said second corresponding one of said programmable trigger function blocks a programmed iteration count number of times.

8. The debug trigger apparatus of claim 7, wherein one or more of the plurality of trigger function blocks is configured to further monitor said iteration counter enable signal and to include said iteration counter enable signal in performing said programmed boolean minterm function.

9. A method for collecting a continuous trace of internal test node signal events occurring on internal test nodes of an integrated circuit, comprising the steps of:

(a) setting a delay time to an initial value;

(b) resetting said integrated circuit to an initial state;

(c) programming a programmed trigger event of a programmable debug trigger apparatus to a predetermined trigger capture event and a programmed time delay to said delay time, said programmable debug trigger apparatus disposed internal and integral to said integrated circuit and configured to receive a plurality of integrated circuit signals of said integrated circuit and to generate a trigger capture signal said programmed time delay after said plurality of integrated circuit signals satisfy a predetermined relationship to said programmed trigger event;

(d) programming said internal programmable debug trigger apparatus to latch a test access port which monitors a plurality of test nodes internal to said integrated circuit upon the occurrence of said trigger capture signal and to signal an external pulse on an external pulse pin of said integrated circuit within a programmed delay after the occurrence of said trigger capture signal, wherein said programmed delay is set to said delay count;

(e) initiating operation of said integrated circuit;

(f) latching a plurality of test node signals present on a plurality of test nodes internal to said integrated circuit when said trigger capture signal is received;

(g) outputting an external output signal to indicate that said plurality of test node signals have been latched;

(h) retrieving said plurality of test node signals when said external output signal indicates that said plurality of test node signals have been latched;

(i) determining if more trace events are needed; and (j) incrementing said delay count and repeating steps (b) through (i) if more trace events are needed.

10. The method of claim 9, further comprising the step of:

(k) storing said retrieved plurality of test node signals retrieved in step (h) in an event trace file.

11. The method of claim 9, further comprising the step of:

(l) displaying said retrieved plurality of test node signals retrieved in step (h) on an event trace screen.

12. A test system for debugging functional and electrical failures of an integrated circuit, comprising:

a programmable debug trigger apparatus disposed internal and integral to said integrated circuit for generating a trigger capture signal a programmed time delay after a plurality of integrated circuit signals satisfy a predetermined relationship to a programmed trigger event;

a test access port (TAP) disposed internal and integral to said integrated circuit comprising a TAP latch, said TAP latch coupled to a plurality of test nodes internal to said integrated circuit and responsive to said trigger capture signal for latching a plurality of test node signals present on said plurality of test nodes when said trigger capture signal is received;

an external output of said integrated circuit coupled to said TAP and responsive to said trigger capture signal for outputting an external output signal to indicate that said TAP latch has been latched;

a reset input of said integrated circuit for resetting said integrated circuit to an initial state;

a test access port retrieval system coupled to said TAP; and a diagnostics retrieval system coupled to said integrated circuit and configured to reset said integrated circuit to said initial state, to program said programmed trigger event to a predetermined trigger capture event and said programmed time delay to a first delay value, to receive said external output signal, and to retrieve said plurality of test node signals from said TAP latch when said external output signal indicates that said TAP latch has been latched, to reset the integrated circuit again, to program said programmed trigger event to said predetermined trigger capture event and said programmed time delay to a second delay value which is incrementally greater than said first delay value, to receive said external output signal, and to retrieve said plurality of test node signals from said TAP latch when said external output signal indicates that said TAP latch has been latched;

wherein said programmable debug trigger apparatus comprises:

a plurality of programmable trigger registers disposed internal and integral to said integrated circuit, each trigger register configured to receive a plurality of integrated circuit signals, to compare each of said plurality of integrated circuit signals of said integrated circuit to a programmed trigger condition, and to produce a trigger match signal when said plurality of integrated circuit signals match said programmed trigger condition;

a plurality of programmable trigger function blocks disposed internal and integral to said integrated circuit, each trigger function block coupled to receive a plurality of said trigger match signals and performing a programmed boolean minterm function on the monitored trigger match signals to produce a trigger capture signal; and a programmable timer disposed internal and integral to said integrated circuit enabled by said trigger capture signal of a first corresponding one of said programmable trigger function blocks to generate a timer enable signal upon completion of a programmed time delay.

13. The test system of claim 12, said debug trigger apparatus further comprising:

a programmable iteration counter disposed internal and integral to said integrated circuit and coupled to receive said trigger capture signal of a second corresponding one of said programmable trigger function blocks, said programmable iteration counter generating an iteration count enable signal upon receipt of said trigger capture signal of said second corresponding one of said programmable trigger function blocks a programmed iteration count number of times.

14. The test system of claim 13, wherein one or more of the plurality of trigger function blocks of the debug trigger apparatus is configured to further monitor said iteration counter enable signal and to include said iteration counter enable signal in performing said programmed boolean minterm function.

* * * * *